US008136010B2

(12) United States Patent
Leonard et al.

(10) Patent No.: US 8,136,010 B2
(45) Date of Patent: *Mar. 13, 2012

(54) APPARATUS FOR PIPELINED CYCLIC REDUNDANCY CHECK CIRCUIT WITH MULTIPLE INTERMEDIATE OUTPUTS

(75) Inventors: Todd E. Leonard, Williston, VT (US); Gregory J. Mann, Wheaton, IL (US)

(73) Assignee: International Business Machines Corporation, Armonk, NY (US)

( * ) Notice: Subject to any disclaimer, the term of this patent is extended or adjusted under 35 U.S.C. 154(b) by 1116 days.

This patent is subject to a terminal disclaimer.

(21) Appl. No.: 11/962,878

(22) Filed: Dec. 21, 2007

(65) Prior Publication Data

US 2009/0164865 A1 Jun. 25, 2009

(51) Int. Cl.
*H03M 13/00* (2006.01)
(52) U.S. Cl. ...................................................... 714/758
(58) Field of Classification Search .................. 714/752, 714/758, 746, 781
See application file for complete search history.

(56) References Cited

U.S. PATENT DOCUMENTS

| 6,038,694 | A | 3/2000 | Swallow |
| 6,357,032 | B1 | 3/2002 | Plotz et al. |
| 6,701,479 | B2 | 3/2004 | Keller |
| 7,328,396 | B2 | 2/2008 | Mann |
| 2007/0234177 | A1 | 10/2007 | Jeon et al. |

OTHER PUBLICATIONS

Notice of Allowance mailed Oct. 4, 2010 from related U.S. Appl. No. 11/673,086.
U.S. Appl. No. 11/673,086, entitled "Apparatus for Pielined Cyclic Redundancy Check Circuit with Multiple Intermediate Outputs" filed on Feb. 9, 2007, First Named Inventor: Todd Leonard.

*Primary Examiner* — Shelly A Chase
(74) *Attorney, Agent, or Firm* — Scully, Scott, Murphy & Presser, P.C.; Michael J. LeStrange, Esq.

(57) ABSTRACT

A CRC redundancy calculation circuit and a design structure including the circuit embodied in a machine readable medium are presented. The CRC redundancy calculation circuit is pipelined to run at high frequencies and configured to operate on an arbitrary multiple of the base granularity of the data packet. Additionally, the CRC redundancy calculation circuit provides the same multiple of outputs that provide intermediary output remainder values. Thus, for example, a circuit which processes 24 bytes of packet data per cycle and which the packets have a 4 byte granularity, the CRC redundancy calculation circuit provides 6 output remainder values, one for each 4 byte slice of data.

7 Claims, 12 Drawing Sheets

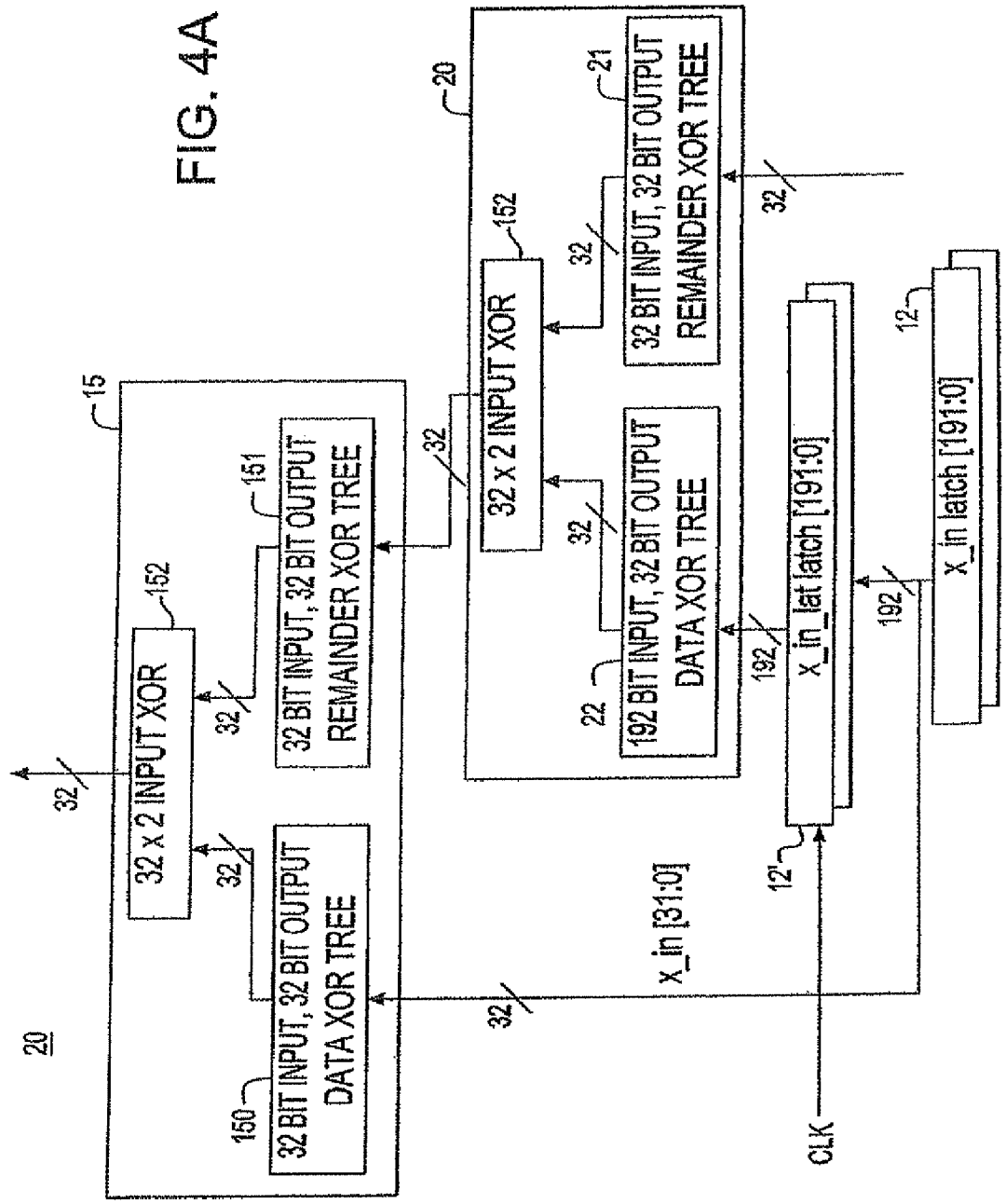

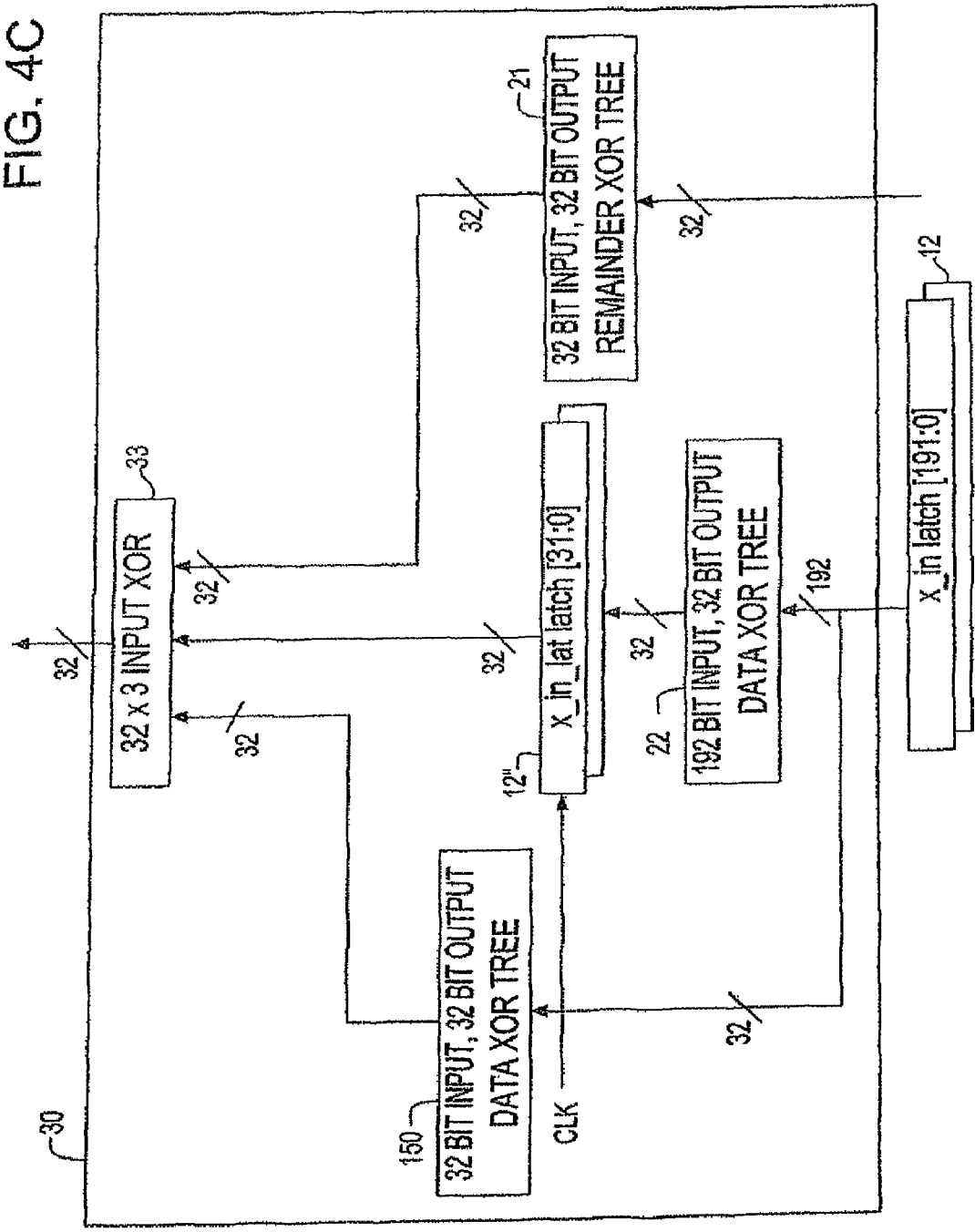

APPARATUS FOR PIPELINED CYCLIC REDUNDANCY CHECK CIRCUIT WITH MULTIPLE INTERMEDIATE OUTPUTS

This application is related to co-pending and co-assigned U.S. patent application Ser. No. 11/673,086, filed Feb. 9, 2007, currently pending.

BACKGROUND OF THE INVENTION

1. Field of the Invention

The present invention relates generally to systems for ensuring integrity of data communications in high bandwidth applications, and more particularly, to a novel apparatus for providing data redundancy checks and a design structure including the apparatus embodied in a machine readable medium.

2. Discussion of the Prior Art

A typical requirement of any data transfer system, such as a high-speed PCI Express or Infiniband serial bus system, is to provide verification of write data transferred by the system. Thus, typically, write data is encoded in accordance with an error checking algorithm, such as a cyclic redundancy check algorithm (CRC), and the resultant check data appended to the write data. The data is then checked at the other side of the PCI bus system by the same algorithm, including the check data, and, if the data is error free, the remainder of the redundancy calculation is typically an all zero output.

The majority of current communications standards require the computation of a Cyclic Redundancy Check (CRC) for data packets sent. As successive standards increase the bandwidth of data, the bandwidth for CRC computation will likewise increase. Current CRC circuits that provide CRC redundancy calculations do not scale well as the CRC value increases, nor as the amount of data processed per cycle increases. Sizes of current solutions can scale with the square of the amount of data processed per cycle.

Previous solutions addressed increased bandwidth. For example, commonly-owned, co-pending United States Patent Publication No. U.S. 2005/0268209 (hereinafter "the '209 publication") assigned to International Business Machines Corp., and incorporated by reference as if fully set forth herein, describes a novel cyclic redundancy check generation circuit that comprises an efficient pipelined solution with built in recursion for increasing bandwidth. Thus, a fast pipelined CRC circuit that operates on 256 bits of data per cycle is known in the art, however, a total data length of the data packet must be a multiple of 256 bits. While this may be acceptable in some highly specific situations, many common industry standards have a much smaller data packet granularity, which would prevent the applicability of the previous solutions. For example, both the Infiniband and PCI-Express bidirectional serial data bus configurations that provide very fast serial connection, e.g., at least 2.5 gigabits per second (Gbit/s) or greater in each direction, utilize packets that are multiples of 32 bits in length. Any CRC circuit that operates on these standards will need to function at a high bandwidth and operate on a 32 bit granularity, as well as being restrained size-wise.

FIG. 1A illustrates conceptually a current solution 10 requiring the cascading of 32 bit CRC calculators, for example, each combinatorial CRC32_32 block 15 within combinatorial block 11 representing the circuitry for calculating the CRC signature for each successive 32 bit portion of the data (message) latch 12. It is understood that the byte granularity is configurable depending upon the application, e.g., may be sixteen bytes or eight bytes, etc. For example, the CRC32 block 15a generating the CRC signature for the first 32 bits of the message slice, the next block 15b for the first 64 bits, and so on. Thus, the last block 15n calculates the CRC signature for the 192 bit message. The latch 16 at the output feeds back the data to the first 32 byte calculator 15a, so that the next cycle can begin for the next data portion. Each output 14 represents the CRC remainder computed on a specific multiple of the base granularity date message. For example, output 14a represents the CRC signature for the first 32 bits of the message slice, output 14b for the first 64 bits, and so on. Thus output 14n represents the CRC signature for the 192 bit message slice. However, this solution effectually linearly increases the critical timing path as the size of the data message slice increases, which is too long for today's high frequency operations, e.g., 250 MHz operation, or greater, example.

FIG. 1B further illustrates conceptually each CRC calculator block 15. The portion of the data message from data latch 12 is connected to a 32 bit input, 32 bit output data XOR tree 150. The XOR logic in data XOR tree 150 is understood to be constructed to implement the data-related specific type of CRC calculation desired for CRC calculator block 15. The CRC remainder input to CRC calculator block 15 is connected to a 32 bit input, 32 bit output remainder NOR tree 151. The XOR logic in remainder XOR tree 151 is understood to be constructed to implement the remainder-related specific type of CRC calculation desired for CRC calculator block 15. The outputs of XOR trees 150 and 151 are connected to a 32×2 input XOR function block 152.

FIG. 2 illustrates a CRC calculator solution 18 as described in the exemplary related art described in the '209 publication, which includes a first partition comprising a set of XOR subtrees and latches 215 for processing the data bits and a second partition is a set of XOR subtrees and latches 210 for processing the remainder bits of the CRC. Both partitions are multi-level partitions, each level comprised of multiple XOR subtrees and latches. The outputs of XOR subtrees and latches 210 and 215 are connected to a 32 by 2-input XOR gate 220. The output of XOR gate 220 is connected to a current CRC remainder latch 205. The output of latch 205 is connected to remainder partition NOR subtrees and latches 210. Preferably, each XOR subtrees of the data partition is no slower than the slowest XOR subtree in the remainder partition. Each level of NOR subtrees performs a portion of the CRC calculation and each XOR subtree belonging to a particular level performs a portion of the portion of the CRC calculation performed by the level. The size of the largest remainder subtree is chosen so that all the XOR calculation it performs can be completed in one clock cycle at the desired frequency. Since all the XOR subtrees of the data partition and the remainder partition are no slower than the slowest remainder XOR subtree, each data partition levels portion of the CRC is preferably performed in one clock cycle or less.

With reference to the FIG. 2, the prior art apparatus as described in the '209 publication is still fixed to the m-bit wide data portions and messages are typically not multiples of "m" bits. M on the average could be m=192 bits, e.g. multiples of 32 bits, however, messaging generally implements packets that are not necessarily multiples of M -thus, there may be leftover bits. Consequently, there needs to be a mechanism for calculating the CRC signature for the leftover bits 8 or 16, or like multiple of the base granularity (e.g., 32 bits). That is, a mechanism is needed to obtain the CRC signature of only last message portion (i.e. leftover information).

It would thus be highly desirable to provide a CRC circuit, system and method that is pipelined to run at high frequencies that operates on these standards, i.e., is capable of processing at a high bandwidth and operate on a 32 bit packet granularity, as well as operating on an arbitrary multiple of the base granularity of the data packet.

It would further be highly desirable to provide a CRC circuit, system and method that is pipelined to run at high frequencies system and that additionally operates on an arbitrary multiple of the base granularity of the data packet, and provides the same multiple of outputs that provide intermediary output remainder values.

SUMMARY OF THE INVENTION

The present invention addresses improvements in the CRC redundancy systems generally, and particularly is directed to a novel CRC circuit employed in data redundancy systems which is pipelined to run at high frequencies.

According to the present invention, there is provided a CRC circuit that is pipelined to run at high frequencies. This CRC circuit also operates on an arbitrary multiple of the base granularity of the data packet, and provides the same multiple of outputs that provide intermediary output remainder values. Thus, for example, a circuit which processes 24 bytes of packet data per cycle and which the packets have a 4 byte granularity, this disclosure describes a CRC circuit that provides 6 output remainder values, one for each 4 byte slice of data.

Thus, there is provided a method and apparatus for pipelined cyclic redundancy check (CRC), the apparatus comprising:

a plurality of cascaded CRC calculator blocks each for generating a CRC value for data of a respective slice of a data packet;

a plurality of XOR logic trees adapted to accept CRC input data, the XOR logic trees coupled to the plurality of cascaded CRC calculator blocks and generating intermediate CRC remainder results; and, at least one remainder latch device adapted to receive and save an intermediate CRC remainder result between the cascaded CRC calculator blocks.

In the apparatus, one remainder latch device is coupled in series between two cascaded CRC calculator blocks for reducing a critical path length.

Moreover, the apparatus effects the realization that the CRC input to CRC calculator block could actually be a combinatorial output of the previous cycle of packet data and the previous cycle CRC value. Thus, a first of the cascaded CRC calculator blocks receives a CRC packet data slice input at a cycle "j" comprising a combinatorial output of a previous cycle of packet data for cycle "j−1" and a previous cycle CRC value (for cycle j−1), in a pipelined process.

Moreover, a first of the at least one remainder latch devices is propagated through the critical path to achieve balanced timing paths.

Advantageously, the pipelined cyclic redundancy check (CRC) apparatus is adapted for CRC processing an arbitrary multiple of a base granularity byte value of a data packet.

Advantageously, according to the apparatus and methodology of the invention, many recursive steps potentially implemented for a CRC calculator block depending upon the configuration.

In another aspect of the invention, a design structure embodied in a machine readable medium is also provided that includes:

a plurality of cascaded CRC calculator blocks each for generating a CRC value for data of a respective slice of a data packet;

a plurality of XOR logic trees adapted to accept CRC input data, the XOR logic trees coupled to the plurality of cascaded CRC calculator blocks and generating intermediate CRC remainder results; and, at least one remainder latch device adapted to receive and save an intermediate CRC remainder result between the cascaded CRC calculator blocks.

In another aspect of the invention, a design structure embodied in a machine readable medium is also provided that includes:

a plurality of cascaded CRC calculator blocks each for generating a CRC value for data of a respective slice of a data packet, wherein a first of said cascaded CRC calculator blocks receives a CRC packet data slice input at a cycle "j" comprising a combinatorial output of a previous cycle of packet data for cycle "j−1" and a previous cycle CRC value for cycle j−1, in a pipelined process, and wherein a first of said at least one remainder latch devices is propagated through the critical path to achieve balanced timing paths;

a plurality of XOR logic trees adapted to accept CRC input data, the XOR logic trees coupled to the plurality of cascaded CRC calculator blocks and generating intermediate CRC remainder results;

at least one remainder latch device adapted to receive and save an intermediate CRC remainder result between the cascaded CRC calculator blocks; and means for initializing a CRC remainder value when generating a CRC redundancy check value in a first cycle.

BRIEF DESCRIPTION OF THE DRAWINGS

The objects, features and advantages of the present invention will become apparent to one skilled in the art, in view of the following detailed description taken in combination with the attached drawings, in which:

FIG. 4A illustrates a CRC calculator block 30 comprising a cascaded CRC32_32 block preceded by a CRC192_32 bloc and the previous latched cycle data 12' (cycle j−1);

FIG. 4C illustrates a preferred embodiment wherein all XOR logic blocks are collapsed;

DETAILED DESCRIPTION OF THE PREFERRED EMBODIMENTS

Figure 1A:
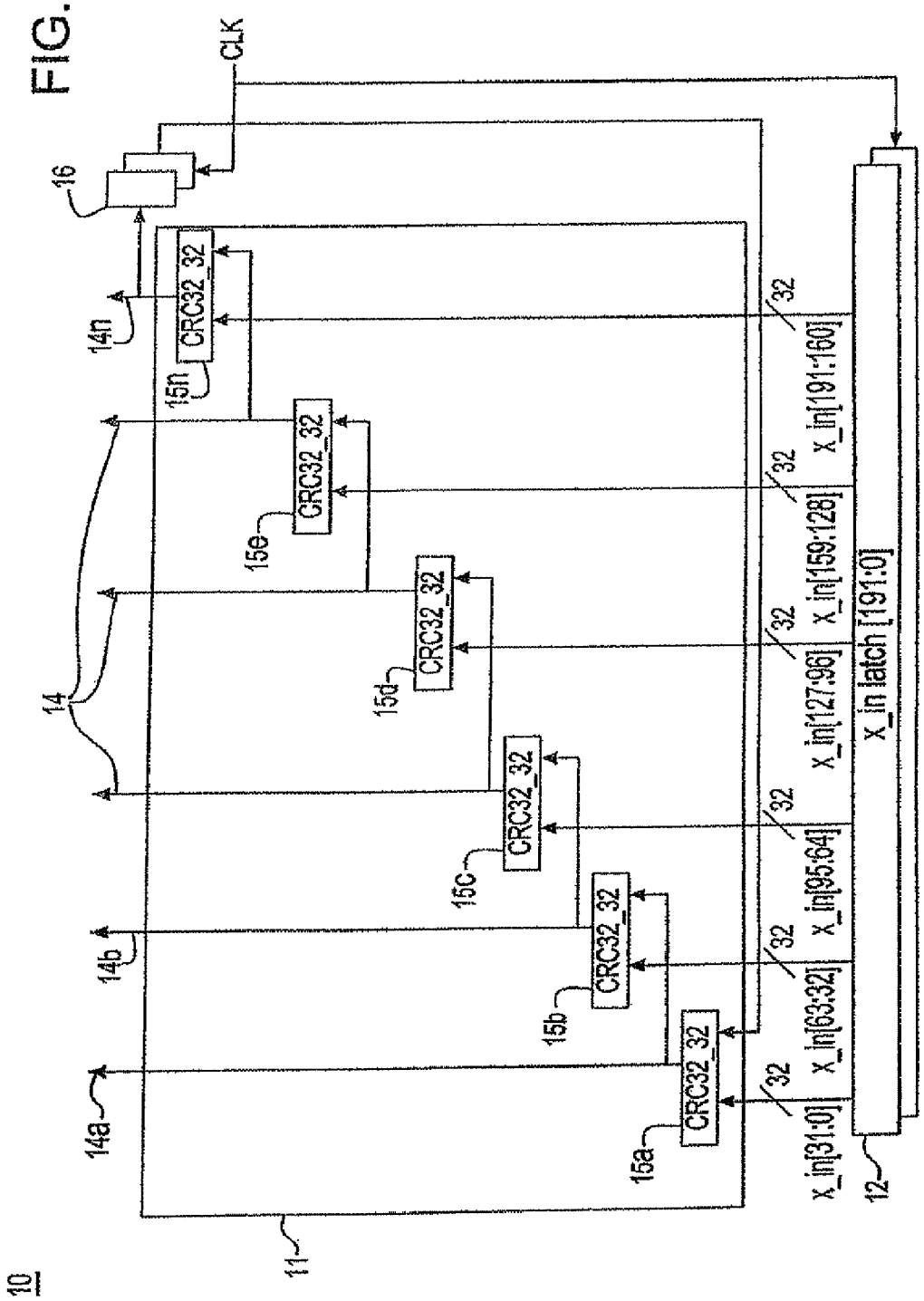
FIG. 1A depicts a current CRC solution 10 having cascading 32 byte calculators that would double the critical path length, which results in too long a path for a 250 MHz communication channel.
Figure 1B:
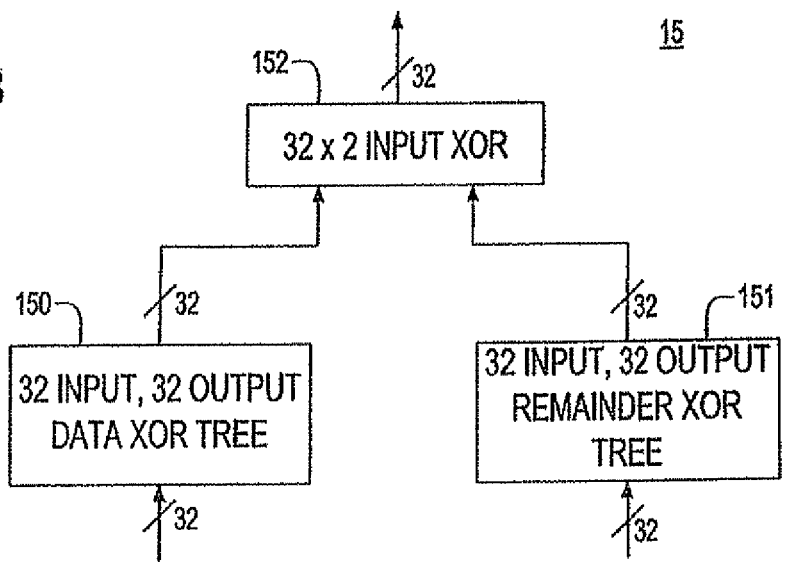
FIG. 1B depicts a combinatorial 32 bit CRC calculator 15 such as implemented in the current CRC solution of FIG. 1.
Figure 2:
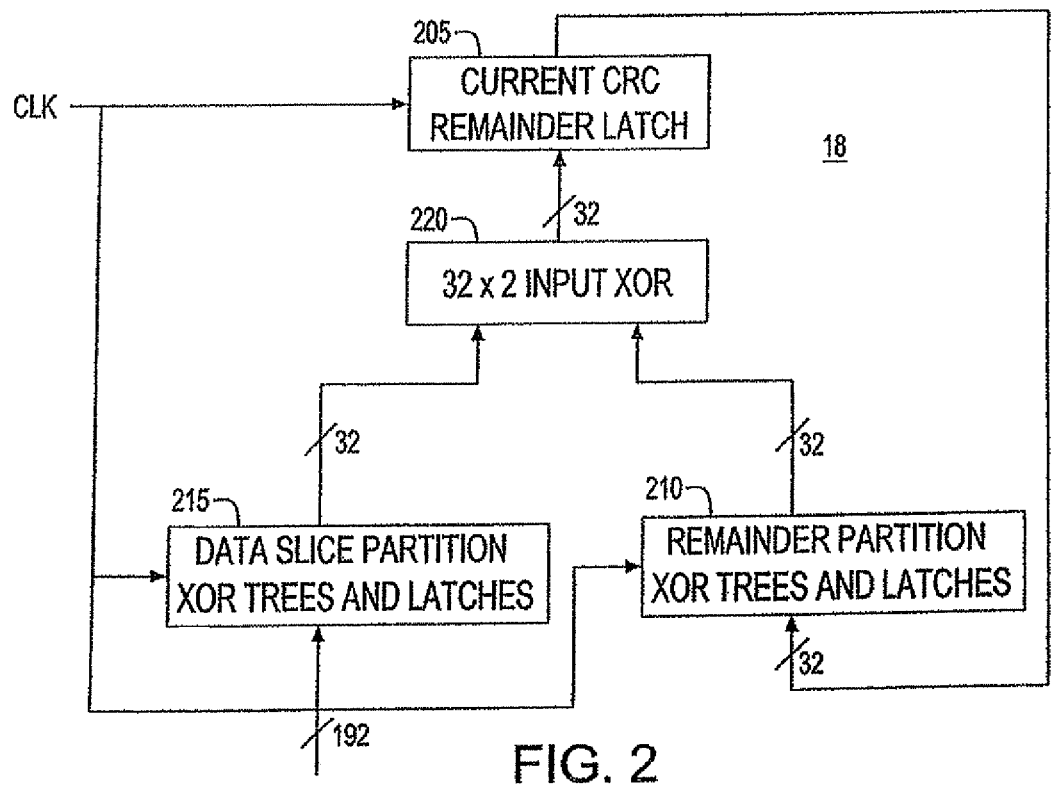
FIG. 2 depicts a an exemplary 32-bit CRC circuit calculator 18 in accordance with the '209 publication.
Figure 3A:
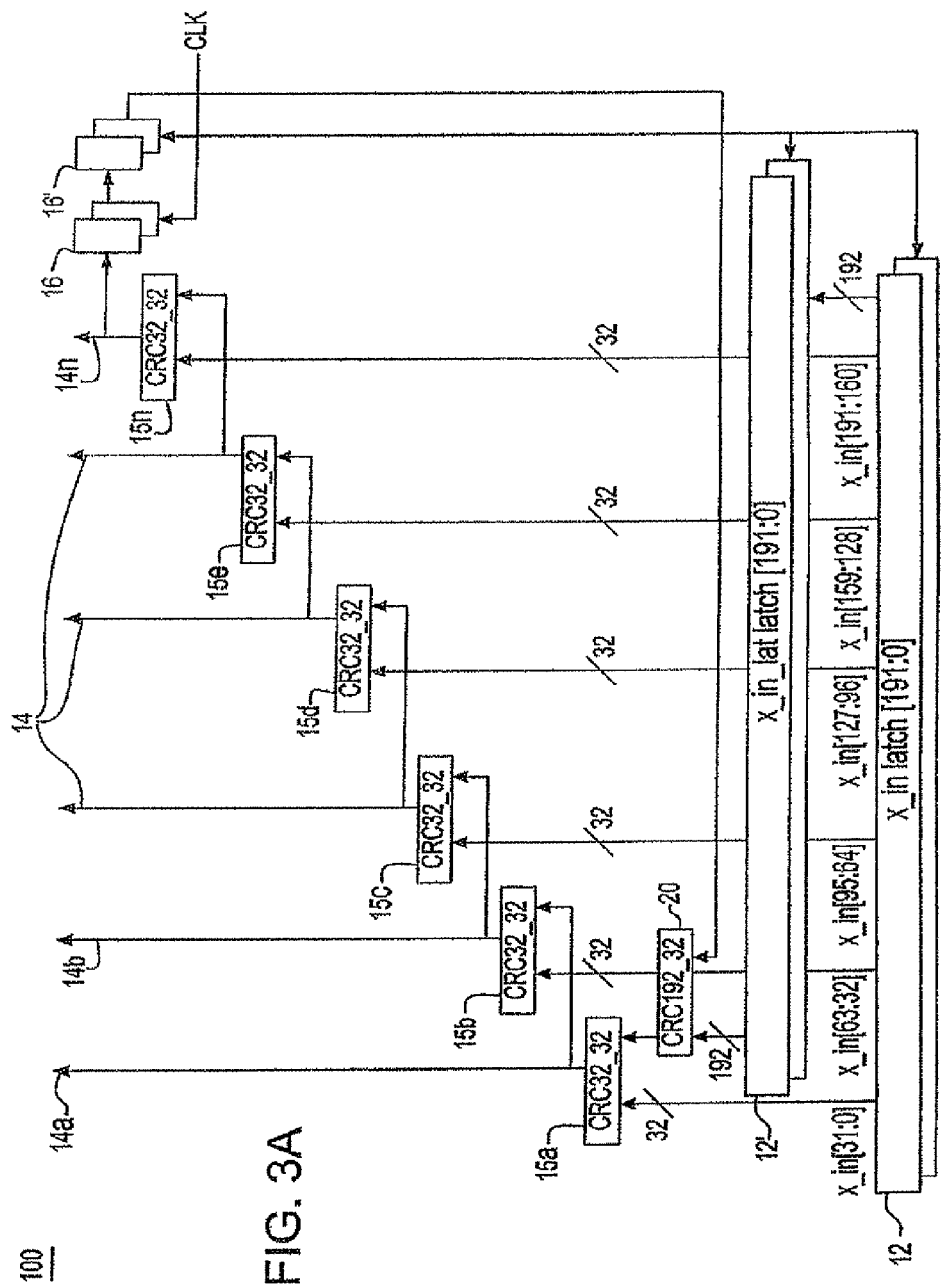
FIG. 3A depicts a CRC '209 solution 100 according to a first embodiment of the invention, that implements cascading of 32 byte calculators 15" whereby the CRC input to the first calculator, e.g., at a cycle "j" is a combinatorial output of the previous cycle of packet data (for cycle j−1) and the previous cycle CRC value (for cycle j−1) in a pipelined process.

As an extension to the teachings provided in the '209 publication, FIG. 3A illustrates an intermediary pipelined CRC redundancy check solution 100 according to a first embodiment of the invention, that implements the cascading of 32 byte calculators 15a, . . . , 15n whereby each CRC input to a calculator, e.g., at a cycle "j" is actually a combinatorial output of the previous cycle of packet data (data from data latch 12' for cycle "j−1") and the previous cycle CRC value (for cycle j−1), in a pipelined process. Thus, the CRC calculator block 20 labeled CRC192_32, represents the combinatorial calculation of a 32 bit CRC from 192 bits of data for the previous cycle data 12' (cycle j−1) and provides the CRC remainder for the next cycle processing, i.e., cycle "j" processing. That is, the output of CRC calculator block 20 labeled CRC192_32 is actually the output 14n of the combinatorial cascaded calculator block 11 of FIG. 1A for input to the CRC32_32 block 15a. As shown in FIG. 3A, by computing two cycles worth (cycle j−1 and cycle j) of CRC data, two latches 16, 16' are provided for latching current CRC remainder (cycle j) and the CRC remainder (cycle j−1), respectively, that are fed back to the CRC byte calculators.

Figure 3B:
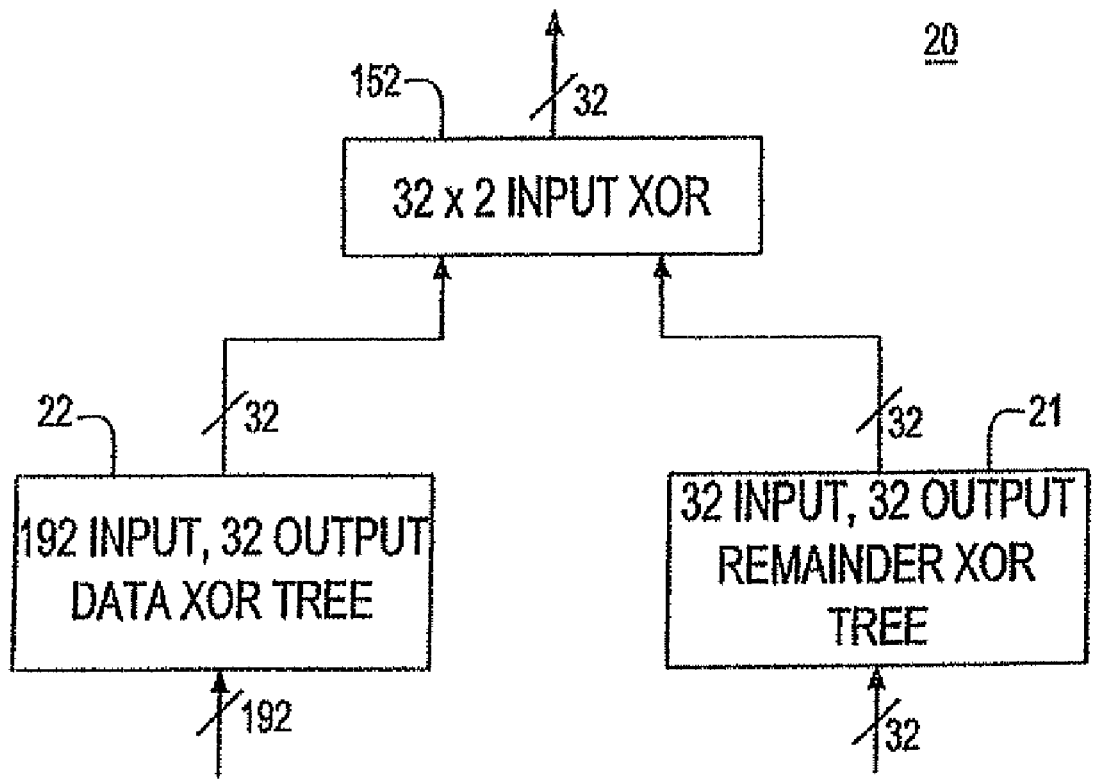
FIG. 3B depicts a CRC calculator block 20 as implemented in FIG. 3A, calculating CRC remainder values on 192 bits of packet data.

FIG. 3B illustrates the CRC calculator block 20 of FIG. 3A. The data from data latch 12' is connected to a 192 bit input, 32 bit output data XOR tree 22. The XOR logic in data XOR tree 22 is understood to be constructed to implement the data-related specific type of CRC calculation desired for CRC calculator block 20. The CRC remainder input to CRC calculator block 20 is connected to a 32 bit input, 32 bit output remainder XOR tree 21. The XOR logic in remainder XOR tree 21 is understood to be constructed to implement the remainder-related specific type of CRC calculation desired for CRC calculator block 20. The outputs of XOR trees 21 and 22 are connected to a 32×2 input XOR function block 152.

Figure 4B:
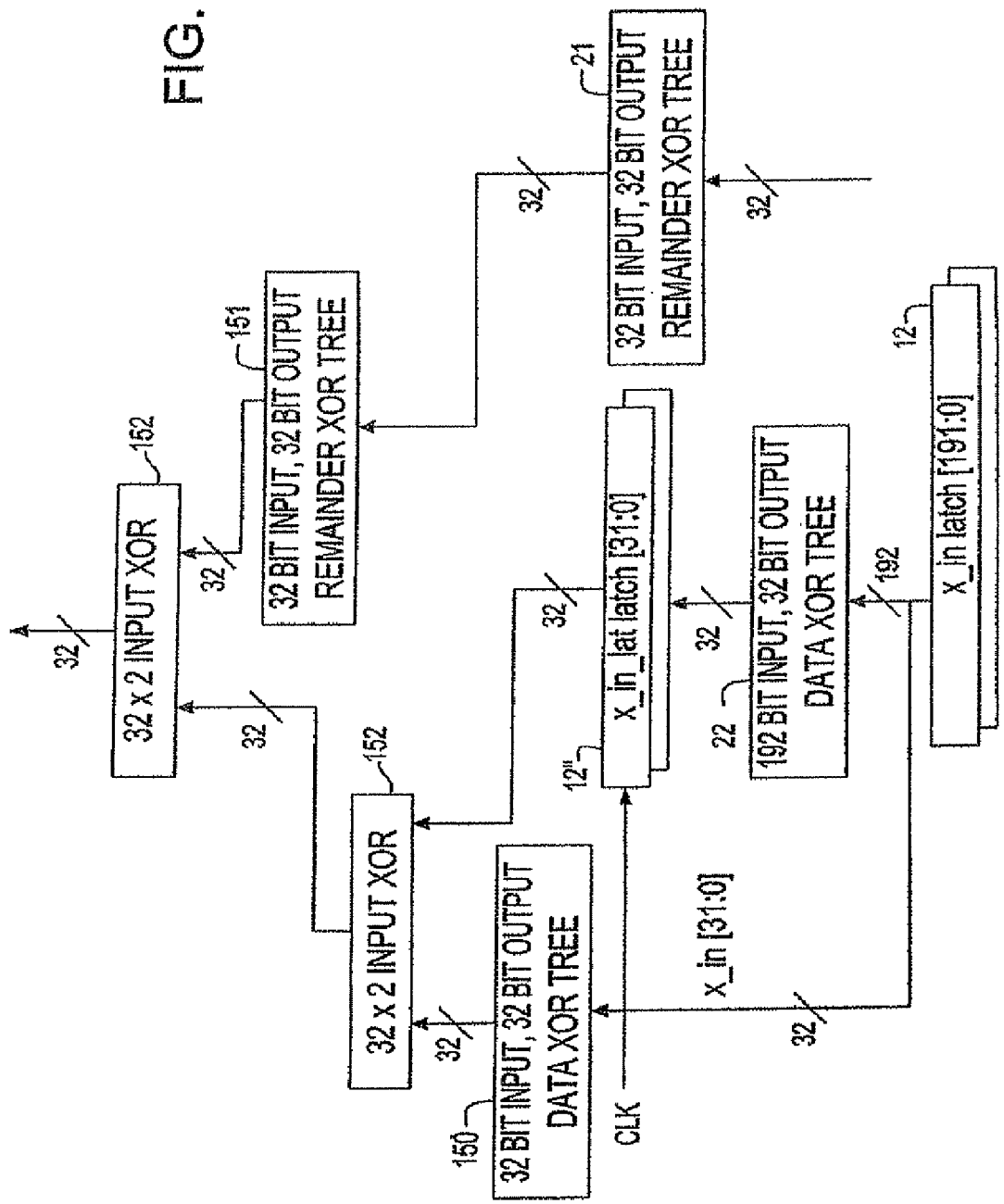
FIG. 4B illustrates an alternative embodiment wherein the X_in latch can be pushed through its portion of the XOR tree, resulting in approximately the same critical path as a normal CRC32_32 block of FIG. 1.

Referring now to FIG. 4A, the calculation of the leftmost output 14a of FIG. 3A is depicted as comprising a cascaded CRC32_32 block 15 preceded by a CRC192_32 block 20 and the previous latched cycle data 12' (cycle j−1). FIG. 4A thus depicts one solution, however, the combinatorial logic path from the previous latched cycle data 12' to the output of CRC calculator block 15 is excessively long. As depicted in FIG. 4B, the X_in latch 12' is thus removed, and a new latch 12" is added to the output. It is noted that the deletion of latch 12' and addition of latch 12" does not change the functionality of the circuit. It is additionally noted that the arrangement of the XOR logic blocks (150, 152) has been changed, and understood that this also does not change the functionality of the circuit.

Referring now to FIG. 4C, a CRC calculator 30 is depicted. Remainder XOR trees 151 and 21 have combined to form remainder XOR tree 31. XOR logic blocks 150 are combined to form XOR logic block 33. It is noted that when combining cascaded CRC blocks, the size of the XOR tree for the CRC inputs is bounded; it stays roughly the same size no matter the amount of data processed. It is further understood that latch 12" results in the CRC calculator 30 having approximately the same critical path as in the prior solutions, e.g., embodiment 100 depicted in FIG. 3. That is, rolling the latched X_in value into the first block of the CRC calculator yields a pipelined computation of the CRC value. The current data in is XOR'd according to the CRC requirements and latched which preserves the critical timing path. That is, as shown in FIG. 4C, this configuration disregards the large XOR block before the latch, however, it results in about the same length as the overall critical path in the embodiment depicted in FIG. 4A. If it is not, it can be easily added at another stage.

Figure 5:
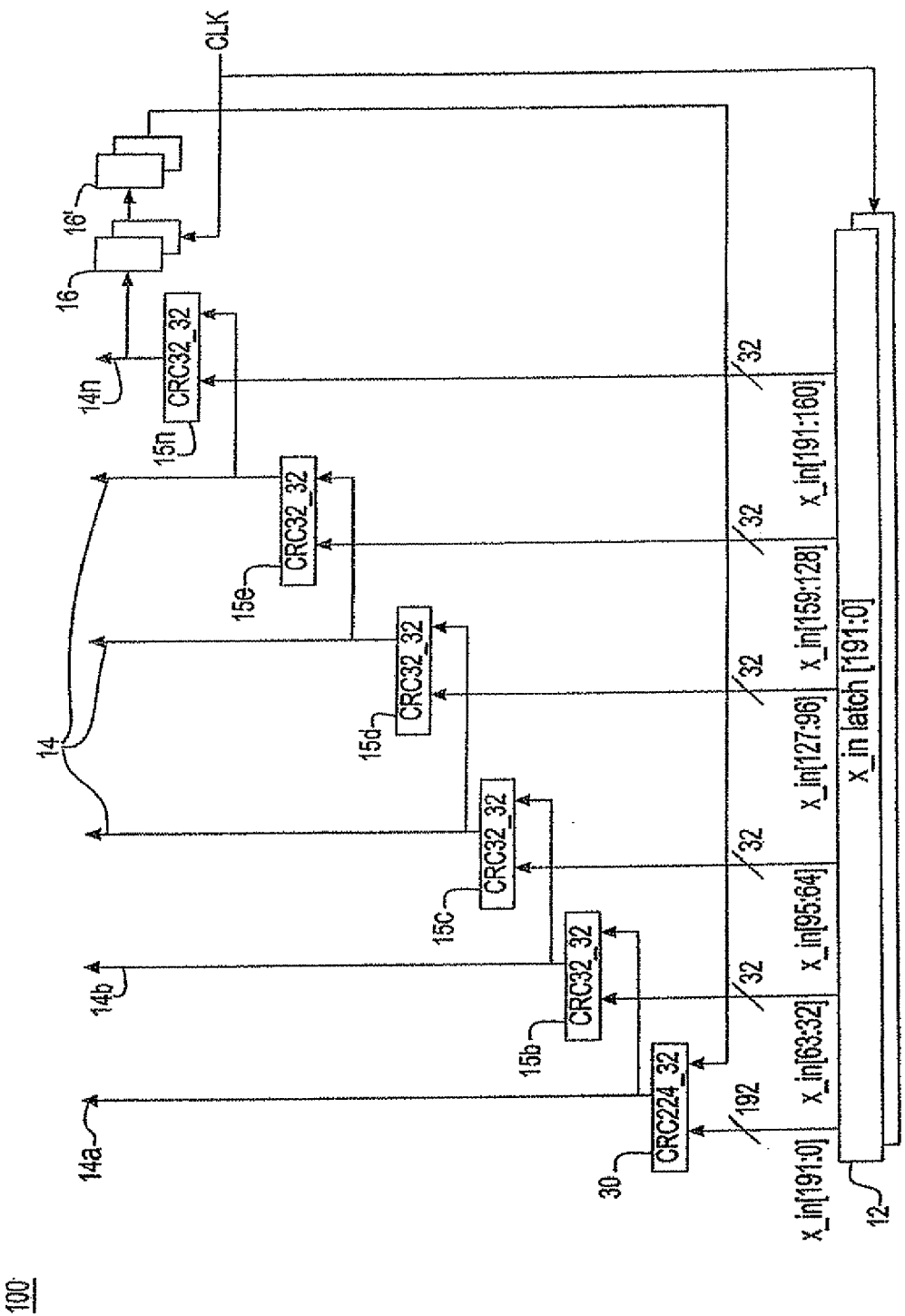
FIG. 5 depicts a CRC solution 200 as in the prior implementation of FIG. 2, however, implementing the cascaded coupling of 32 byte calculators having the same critical path length however with an extra pipeline stage embodied as the CRC224_32 block 30.

FIG. 5 depicts a CRC solution 200 as in the circuit implementation 100 of FIG. 3A, however implementing the cascaded coupling of 32 byte calculators having the same critical path length but with an extra pipeline stage embodied as the CRC224_32 block 30. In this embodiment, however, the critical timing path from CRC224_32 block 30 to output 14n remains unsatisfactorily long. With the presence of latch 16' connected directly the output of latch 16, there is a pipeline stage comprising no logic. These two pipeline stages are unbalanced.

Figure 6:
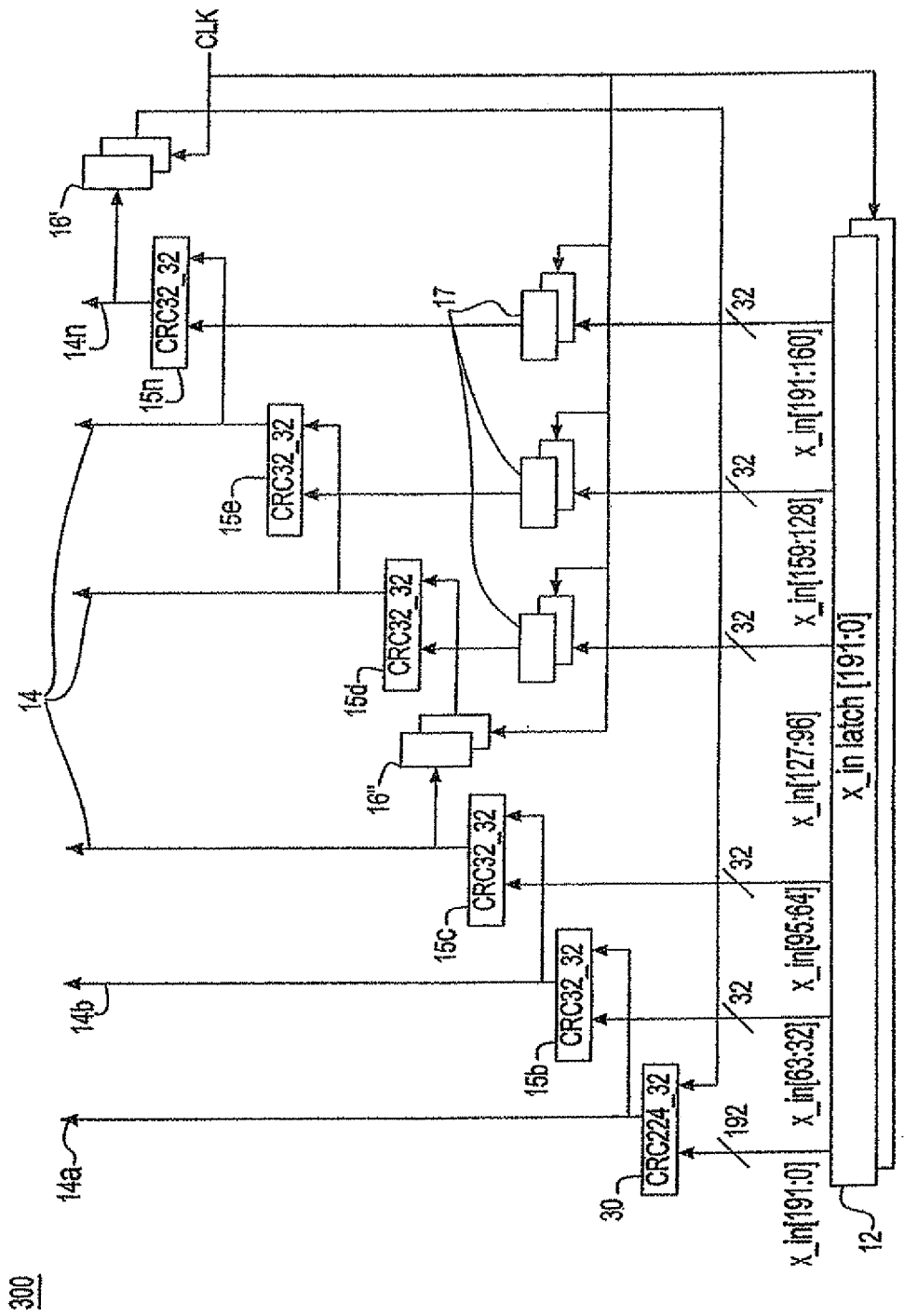
FIG. 6 shows a CRC solution 300 that implements cascading of 32 byte calculators having a reduced critical path length as a result of pushing the latch 16 back through the XOR trees of the circuit 200 of FIG. 5, e.g., by configuring the latch between the third and fourth cascaded CRC blocks 15c, 15d, respectively.

Referring thus to FIG. 6, a CRC calculator solution 300 is depicted whereby latch 16 has been removed, and new latches 16" and 17 are added. Latch 16" is inserted between CRC32_32 block 15c and CRC32_32 block 15d. Latches 17 are added before the data inputs to CRC32_32 blocks 15d, 15e, and 15n. The placement of the latch 16" in the critical path is selected as to provide balance in the two pipelined cycles. The first pipeline stage now comprises of CRC224_32 block 30 and CRC32_32 blocks 15b and 15c. The second pipeline stage now comprises CRC32_32 blocks 15d, 15e, and 15n. It is understood that the deletion of latch 16 and the addition of latches 16" and latches 17 do not change the functionality of the circuit. Thus the cascaded path is now broken in half due to the insertion of latch 16", and consequently the critical timing path length is likewise significantly reduced. Thus, the circuit solution 300 depicted in FIG. 6 operates with increased speed as only three CRC32_32 (combinatorial) blocks are processed before encountering the latch. The only extra logic is the added XOR tree in the CRC224_32 block 30 such as shown in FIG. 4C.

Figure 7:
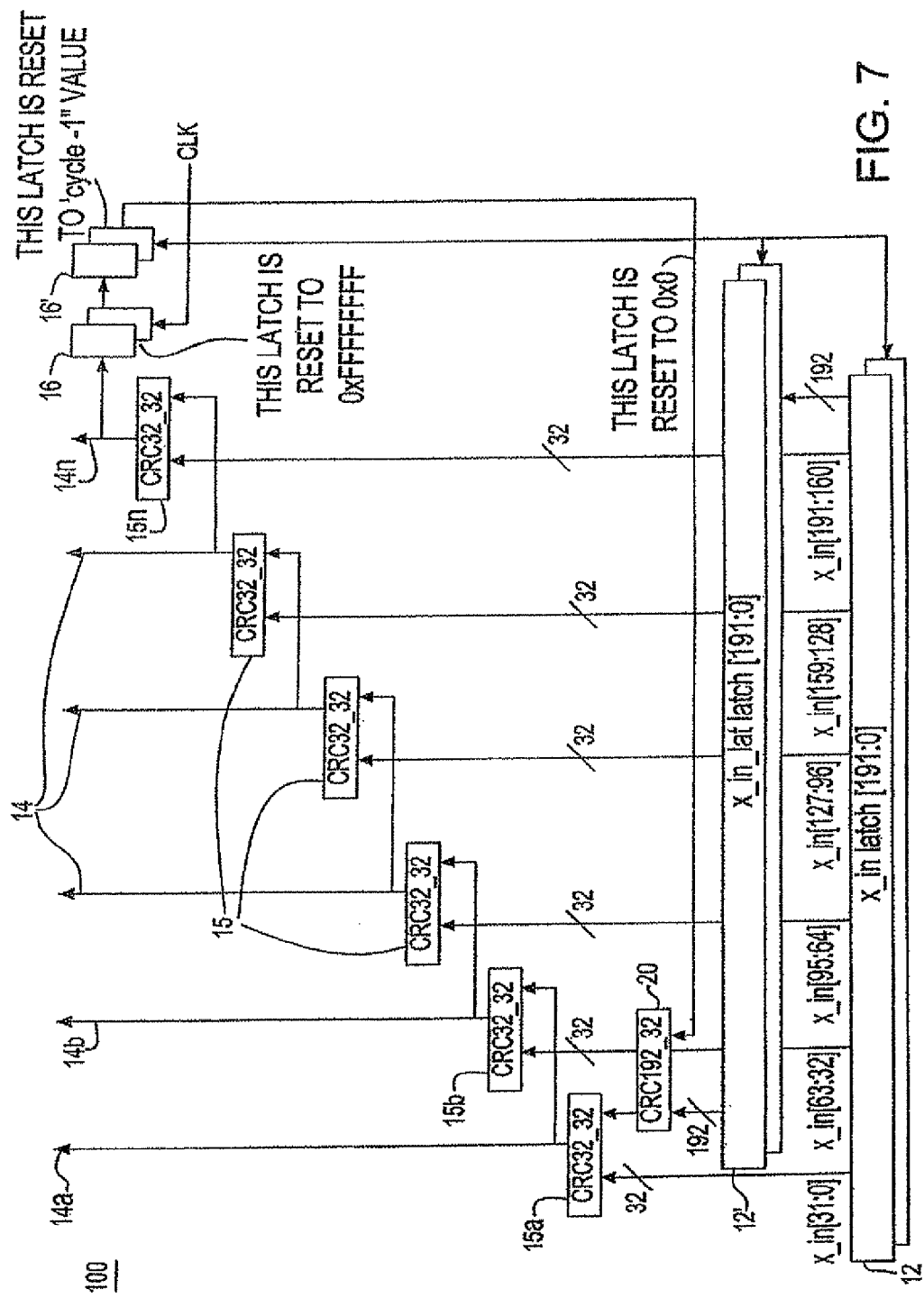
FIG. 7 shows the CRC solution as depicted in the circuit 100 of FIG. 3 however now showing initial latch values (for the latch 16, 16') that are obtained by determining the "negative" CRC values for the packet; and, FIG. 8 is a diagram of a circuit 300 circuit implementing generic parameters including circuitry for initializing packet data input for the "negative" cycles.

One solution for initializing the circuit 300 when the first piece of a packet arrives is now described. Traditionally, the CRC remainder is initialized to an all 1's value at the start of the packet. However, with the circuit of the present invention, the current CRC value is calculated on the previous cycle of data and remainder as well as the current cycle of data. Since at the start of a packet there is no previous cycle of packet data, the solution is to assume values for the "negative" cycle of data, and compute the CRC remainder value that, when computed with the assumed negative packet data, results in the normal initial value of data. Thus, referring for example, to the CRC solution as depicted in the circuit 100 of FIG. 3, now shown in FIG. 7, initial latch values (for the latch 16, 16') are obtained by determining the "negative" CRC values for the packet. Since the CRC calculations are based on the previous two cycles, there is needed a CRC latch value for the cycle-1 (latch 16'). Note, the CRC remainder value latched for Cycle 0 is assumed to be 0xFFFF_FFFF at latch 16. The initial value for latch 16' is calculated by "rewinding" the CRC circuit, and assuming "negative" values of packet data (i.e., all 0's), and then finding the CRC value that would result in the next cycle CRC value to be the cycle 0 value, given the all zeroes of packet data.

Given the initial values previously calculated, these initial values can be pushed as the latches are rolled back (pushed) through the circuit as shown in the embodiment of the CRC redundancy circuit 300 depicted in FIG. 6. Using the assumption that all initial x_in latch values are zero, the value for the middle latch 16" in the cascade is uniquely determined. The latch values 17 on the upper three x_in lines are zero, as is the latch inside of the CRC224_32 block (XOR's of all zero is still zero).

Figure 8:
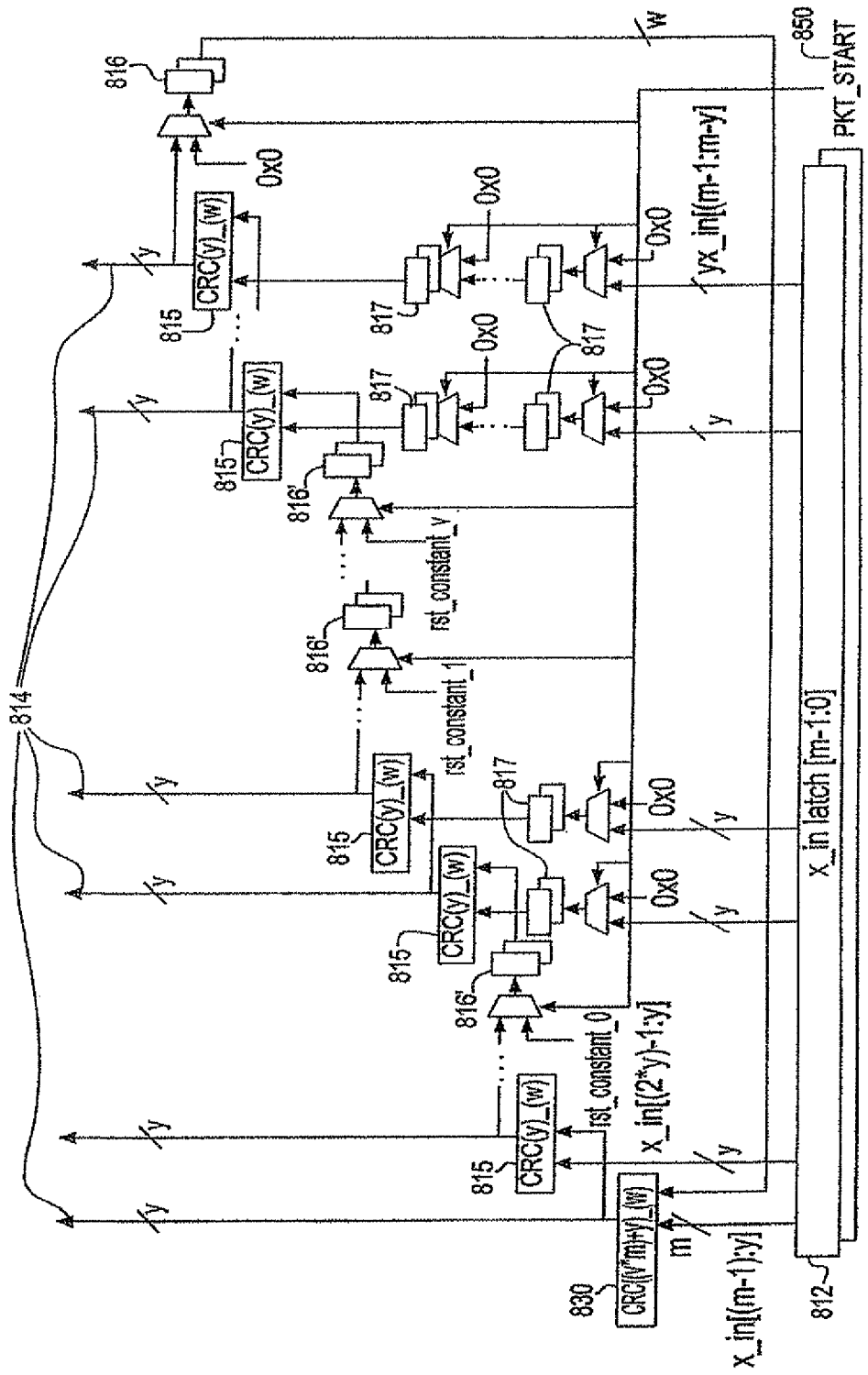

FIG. 8 is a diagram of a circuit 300 circuit implementing generic parameters including circuitry for initializing packet data input for the "negative" cycles. In FIG. 8, the parameters include: v=number of stages; y=smallest granularity of data on which CRC is calculated; m=number of bits in data processed per cycle; z=number of outputs (y*z=m) and w=bit-width of CRC calculation. m-bits of packet data are latched into x_in latch 812. Latch 816 represents the CRC remainder from the previous v cycles. The outputs of latches 816 and 812 are coupled to the inputs of a CRC((v*m)+y)_(w) block 830. This block is constructed in a similar fashion as block 30 in FIGS. 4A, 4B, and 4C. For each stage "v" in CRC calculator 800, the steps depicted in FIGS. 4A, 4B, and 4C are repeated. Thus, as block 30 calculates the data portion of the CRC remainder for the current cycle of data, the previous cycle of data and the previous cycle CRC remainder, block 830 calculates the data portion of the CRC remainder for the current cycle of data, the v previous cycles of data, and the previous v cycle CRC remainder. The output of CRC calculator block 830 is connected to a cascade of CRC(y)_(w) calculator blocks 815. There are z-1 total calculator blocks 815 in the cascade. Evenly distributed along the cascade are v number of latches 816', whose inputs are selectively coupled to either the output of the previous CRC calculator block 815, or to an initial value calculated in the same fashion as described for FIG. 7. This selection is controlled by PKT_START input 850. It is noted that for every latch 816 that is removed from the end of the cascade and inserted into the middle of the cascade, that an addition level of latches 817 are added to the appropriate outputs of x_in latch 12. Latches 817 are inserted before the inputs to those CRC calculator blocks 850 that are not in the first stage of the cascade (i.e. those block 815 cascaded after the first 816' latch. For each successive stage after a latch 816 in the cascade, an additional set of latches 817 are inserted, such that the data inputs to the last stage of calculator blocks 815 have v number of latches 817 inserted. Each of the latches 817 are connected such that their inputs are selectively controlled by PKT_START input 850. When input 850 is asserted, all latches 817 are set to all 0s. Additionally, when input 850 is asserted, all latches 816 and 816' are driven to the calculated initial values. With even distribution of latches 816, the cascaded chain of CRC calculators are cut into v number of pieces, thus reducing the critical cycle time by a factor of v.

Figure 9:
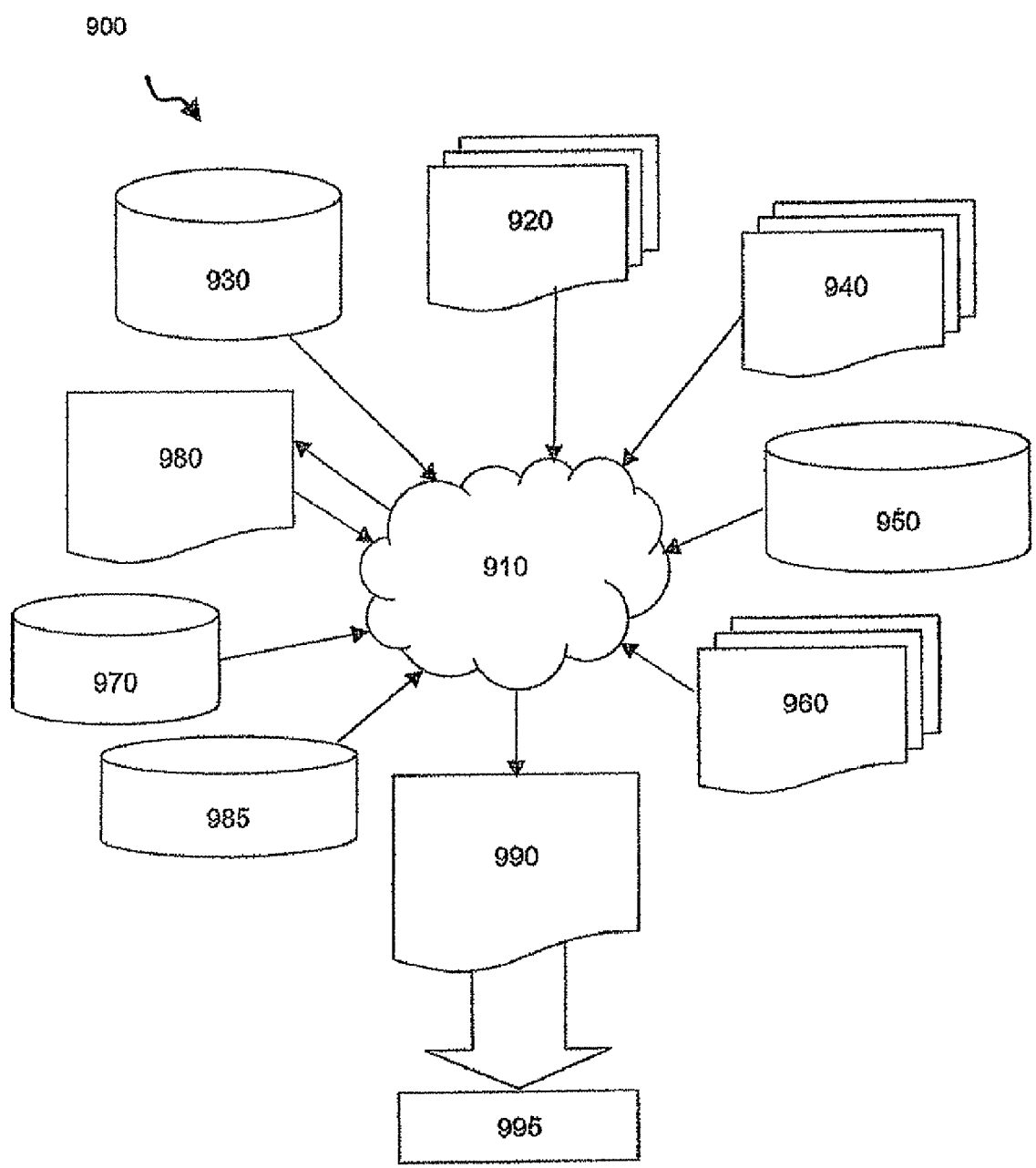
FIG. 9 is a flow diagram of a design process used in semiconductor designing, manufacturing and/or testing.

FIG. 9 shows a block diagram of an example design flow 900. Design flow 900 may vary depending on the type of IC being designed. For example, a design flow 900 for building an application specific IC (ASIC) may differ from a design flow 900 for designating a standard component. Design structure 920 is preferably an input to a design process 910 and may come from an IP provider, core developer, or other design company, or may be generated by the operator of the design flow, or from other sources. Design structure 920 comprises a CRC solution 100 (e.g., FIGS. 3A, 5 and 7) in the form of schematics or HDL, a hardware-description language (e.g., Verilog, VHDL, C, etc.). Design structure 920 may be a text file or a graphical representation of the CRC solution 100. Design process 910 preferably synthesizes (or translates) the CRC solution 100 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations for a given manufacturing technology (e.g., different technology nodes, 32 nm, 45 nm, 90 nm, etc.), design specifications 940, characterization data 950, verification data 960, design specifications 970, and test data files 985 (which may include test patterns and other testing information). Design process 910 may further include, for example, standard circuit design processes such as timing analysis, verification, design rule checking, place and route operations, etc. One of ordinary skill in the art of IC design can appreciate the extent of possible electronic design automation tools and applications used in design process 910 without deviating from the scope and spirit of the invention. The design structure of the invention is not limited to any specific design flow.

Design process 910 preferably translates embodiments of the invention, as shown in FIGS. 1-8, along with any additional integrated circuit design or data into a second design structure 990. Design structure 990 resides on a storage medium in a data format used for the exchange of layout data of integrated circuits (e.g., information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention, as shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A machine readable storage medium embodying a design structure for a pipelined cyclic redundancy check (CRC) circuit, the design structure comprising:
   first data representing a plurality of cascaded CRC calculator blocks each for generating a CRC value for data of a respective slice of a data packet;
   second data representing a plurality of XOR logic trees adapted to accept CRC value input data, the XOR logic trees coupled to the plurality of cascaded CRC calculator blocks and generating intermediate CRC remainder results; and, third data representing at least one remainder latch device coupled in series between two of said cascaded CRC calculator blocks for reducing a critical path length, wherein a machine reading the design structure causes latching of an intermediate CRC remainder result at said least one remainder latch device between the cascaded CRC calculator blocks.

2. The machine readable storage medium as claimed in claim 1, wherein said machine reading the design structure causes a first of said cascaded CRC calculator blocks to receive a CRC packet data slice input at a cycle "j" comprising a combinatorial output of a previous cycle of packet data for cycle "j−1" and a previous cycle CRC value for cycle j−1, in a pipelined process, and wherein a first of said at least one remainder latch devices is propagated through the critical path to achieve balanced timing paths.

3. The machine readable storage medium of claim 1, wherein the design structure comprises a netlist which describes the circuit, and wherein the design structure resides on a storage medium as a data format used for the exchange of layout data of integrated circuits (IC).

4. The machine readable storage medium of claim 1, wherein the design structure includes at least one of test data files, characterization data, verification data, or design specifications.

5. A machine readable storage medium embodying a design structure for a pipelined cyclic redundancy check (CRC) circuit, the design structure comprising:

first data representing a plurality of cascaded CRC calculator blocks each for generating a CRC value for data of a respective slice of a data packet, wherein a first of said cascaded CRC calculator blocks receives a CRC packet data slice input at a cycle "j" comprising a combinatorial output of a previous cycle of packet data for cycle "j−1" and a previous cycle CRC value for cycle j−1, in a pipelined process, and wherein a first of said at least one remainder latch devices is propagated through the critical path to achieve balanced timing paths;

second data representing a plurality of XOR logic trees adapted to accept CRC input data, the XOR logic trees coupled to the plurality of cascaded CRC calculator blocks and generating intermediate CRC remainder results; and third data representing at least one remainder latch device coupled in series between two of said cascaded CRC calculator blocks for reducing a critical path length, wherein a machine reading the design structure causes latching of an intermediate CRC remainder result at said least one remainder latch device between the cascaded CRC calculator blocks, said machine reading the design structure causes initializing a CRC remainder value when generating a CRC redundancy check value in a first cycle.

6. The machine readable storage medium as claimed in claim 5, wherein said CRC circuit is adapted for CRC processing an arbitrary multiple of a base granularity byte value of a data packet, wherein a machine reading the design structure causes latching of an intermediate output remainder value for each slice of data input at the multiple of the base packet granularity input.

7. The machine readable storage medium of claim 5, wherein the design structure comprises a netlist which describes the circuit, and wherein the design structure resides on a storage medium as a data format used for the exchange of layout data of integrated circuits.

* * * * *